United States Patent [19]

Shimada

[11] Patent Number: 4,751,409

[45] Date of Patent: Jun. 14, 1988

[54] COINCIDENCE DECISION CIRCUIT COMPOSED OF MOS OR GATE ARRAY AND MOS AND GATE

[75] Inventor: Jiroh Shimada, Tokyo, Japan

[73] Assignee: NEC Corporation, Japan

[21] Appl. No.: 925,306

[22] Filed: Oct. 31, 1986

[30] Foreign Application Priority Data

Oct. 31, 1985 [JP] Japan ................................ 60-245395

[51] Int. Cl.$^4$ .............................................. H03K 5/26
[52] U.S. Cl. .................................... 307/518; 307/448; 307/452; 307/481; 328/110
[58] Field of Search ............... 307/443, 448, 449, 452, 307/453, 468, 469, 481, 518, 242, 243, 269; 328/110

[56] References Cited

U.S. PATENT DOCUMENTS

| 4,398,101 | 8/1983 | Friauf ................................ 328/110 X |
| 4,501,977 | 2/1985 | Koike ................................ 307/452 X |
| 4,502,014 | 2/1985 | Bismarck ........................... 307/518 X |
| 4,583,012 | 4/1986 | Smith et al. ...................... 307/452 X |
| 4,593,390 | 6/1986 | Hildebrand et al. ............. 307/243 X |
| 4,611,133 | 9/1986 | Peterson et al. ................. 307/443 X |
| 4,645,944 | 2/1987 | Uya ................................... 307/443 X |

Primary Examiner—Stanley D. Miller
Assistant Examiner—D. R. Hudspeth
Attorney, Agent, or Firm—Laff, Whitesel, Conte & Saret

[57] ABSTRACT

A coincidence decision circuit includes a plurality of data inputs and at least one coincidence decision output. This circuit comprises a plurality of coincidence detection circuit each having a plurality of inputs connected to a corresponding number of data inputs selected from the data inputs of the circuit. Each of the coincidence detection circuit is selectively put in an operable condition in response to a given selection signal so as to generate an coincidence detection signal. A circuit is connected to the coincidence detection circuit to respond to a timing signal to read out the coincidence detection signal from the coincidence detection circuit put in the operable condition. Further, another circuit is connected to the read out circuit to output the coincidence detection signal at a predetermined timing.

12 Claims, 4 Drawing Sheets

| R1 | R2 | R3 | R4 | R5 | OD1 | OD2 | OD3 | S̄1=0 | S̄2=0 | S̄3=0 |
|---|---|---|---|---|---|---|---|---|---|---|
| 0 | 0 | 0 | 0 | 0 | 1 | 1 | 1 | 0 | 0 | 0 |
| 0 | 0 | 0 | 0 | 1 | 0 | 1 | 0 | 1 | 0 | 1 |
| 0 | 0 | 0 | 1 | 0 | 1 | 0 | 0 | 0 | 1 | 1 |
| 0 | 0 | 0 | 1 | 1 | 0 | 0 | 0 | 1 | 1 | 1 |
| 0 | 0 | 1 | 0 | 0 | 0 | 0 | 1 | 1 | 1 | 0 |
| 0 | 0 | 1 | 0 | 1 | 0 | 0 | 0 | 1 | 1 | 1 |
| 0 | 0 | 1 | 1 | 0 | 0 | 0 | 0 | 1 | 1 | 1 |
| 0 | 0 | 1 | 1 | 1 | 0 | 0 | 0 | 1 | 1 | 1 |
| 0 | 1 | 0 | 0 | 0 | 1 | 0 | 1 | 0 | 1 | 0 |
| 0 | 1 | 0 | 0 | 1 | 0 | 0 | 0 | 1 | 1 | 1 |
| 0 | 1 | 0 | 1 | 0 | 1 | 0 | 0 | 0 | 1 | 1 |
| 0 | 1 | 0 | 1 | 1 | 0 | 0 | 0 | 1 | 1 | 1 |
| 0 | 1 | 1 | 0 | 0 | 0 | 0 | 1 | 1 | 1 | 0 |
| 0 | 1 | 1 | 0 | 1 | 0 | 0 | 0 | 1 | 1 | 1 |
| 0 | 1 | 1 | 1 | 0 | 0 | 0 | 0 | 1 | 1 | 1 |
| 0 | 1 | 1 | 1 | 1 | 0 | 0 | 0 | 1 | 1 | 1 |
| 1 | 0 | 0 | 0 | 0 | 0 | 1 | 0 | 1 | 0 | 1 |
| 1 | 0 | 0 | 0 | 1 | 0 | 1 | 0 | 1 | 0 | 1 |
| 1 | 0 | 0 | 1 | 0 | 0 | 0 | 0 | 1 | 1 | 1 |
| 1 | 0 | 0 | 1 | 1 | 0 | 0 | 0 | 1 | 1 | 1 |
| ⋮ | ⋮ | ⋮ | ⋮ | ⋮ | ⋮ | ⋮ | ⋮ | ⋮ | ⋮ | ⋮ |
| 1 | 1 | 1 | 1 | 0 | 0 | 0 | 0 | 1 | 1 | 1 |
| 1 | 1 | 1 | 1 | 1 | 0 | 0 | 0 | 1 | 1 | 1 |

REMARKS OD1 = 1: (R1~R5) = (OXOXO)
OD2 = 1: (R1~R5) = (XOOOX) COINCIDENCE: Ō = 0
OD3 = 1: (R1~R5) = (OXXOO)

COINCIDENCE DECISION CIRCUIT COMPOSED OF MOS OR GATE ARRAY AND MOS AND GATE

BACKGROUND OF THE INVENTION

1. Field of the Invention

The present invention relates to a coincidence or identity decision circuit, and more specifically to a coincidence decision circuit composed of field effect transistors (abbreviated "FETs" in this specification).

2. Description of Related Art

Figure 1:
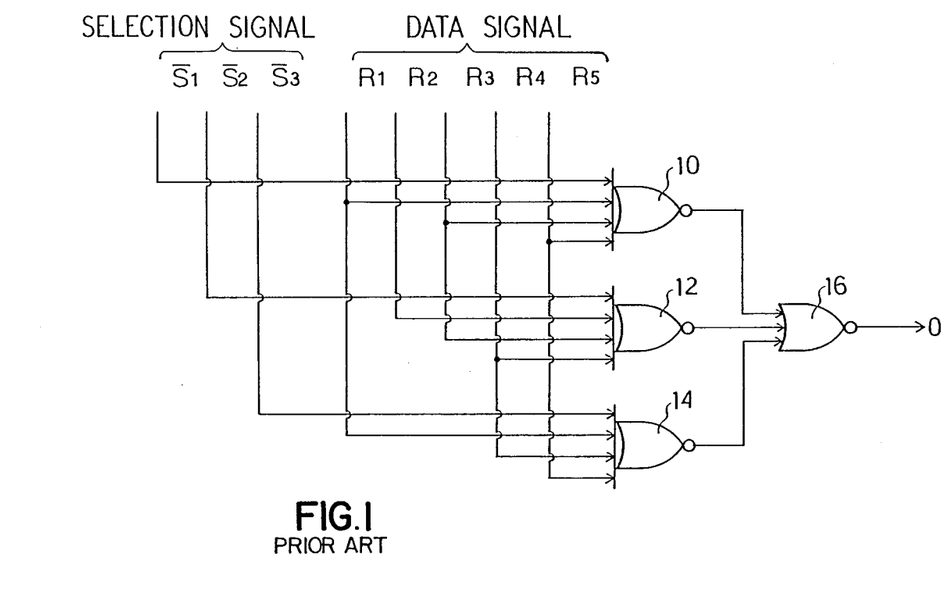
FIG. 1 is a logic circuit diagram illustrating a typical conventional coincidence decision circuit.

Heretofore, the coincidence decision circuit is basically constituted of a combination of logic gates. Referring to FIG. 1, there is shown one typical coincidence decision circuit which includes three input NOR gates 10, 12 and 14 arranged to parallel to each other. One of the input NOR gates 10 is adapted to receive a first coincidence pattern selection signal $\bar{S}_1$ and three binary data signals $R_1$, $R_3$ and $R_5$. The second input NOR gate 12 receives a second coincidence pattern selection signal $\bar{S}_2$ and three binary data signals $R_2$, $R_3$ and $R_4$. The third input NOR gate 14 receives a third coincidence pattern selection signal $\bar{S}_3$ and three binary data signals $R_1$, $R_4$ and $R_5$. Outputs of all the three input NOR gates are connected to an output NOR Gate 16, which generates a coincidence decision output signal "$\bar{O}$".

Thus, the coincidence decision circuit shown in FIG. 1 will execute the logic operation expressed by the following formula:

$$\bar{O} = (\bar{S}_1 + R_1 + R_3 + R_5) \times (\bar{S}_2 + R_2 + R_3 + R_4) \times (\bar{S}_3 + R_1 + R_4 + R_5) \quad (1)$$

where $\bar{O}$, $R_i$ and $\bar{S}_j$ are logic values of 1 or 0.

In the above coincidence decision circuit, the coincidence pattern selection signals $\bar{S}_1$, $\bar{S}_2$ and $\bar{S}_3$ are such that two or more of the control signals are never simultaneously brought into "0". In this condition, if the coincidence pattern selection signal $\bar{S}_1$ is made to "0", the coincidence pattern selection signals $\bar{S}_2$ and $\bar{S}_3$ are then maintained at "1". Therefore, the outputs of the NOR Gates 12 and 14 are kept at "0". On the other hand, when the train of the data signals $(R_1$ to $R_5) = 0, X, 0, X, 0)$ (where x=arbitrary value), the NOR gate 10 outputs "1", with the result that the output "$\bar{O}$" of the NOR gate 16 becomes "0". If the data signal train assumes other combinations of signals, the ouptut of the NOR gate 10 is maintained at "0" and so, the output "$\bar{O}$" is kept at "1". Similarly, in the case of $\bar{S}_2 = $ "0", the output "$\bar{O}$" is brought into "0" only when the data signal train $(R_1$ to $R_5) = (X, 0, 0, 0, X)$. Further, in the case of $\bar{S}_3 = $ "0", the output "$\bar{O}$" is put at "0" only when the data signal train $(R_1$ to $R_5) = (0, X, X, 0, 0)$.

Namely, when the data signal train ($R_1$ to R5) is consistent with a specific pattern designated by the coincidence pattern selection signal $\bar{S}_j$ (j=1 to 3), the coincidence decision output "$\bar{O}$" becomes "0". Otherwise, the decision output "$\bar{O}$" is maintained at "1".

As mentioned above, conventional coincidence circuits have been constructed to peform the logical function expressed by the logical formula (1) mentioned above or similar logical functions, and have been widely used as general purpose coincidence decision circuits. Here, examining the coincidence circuit shown in FIG. 1, the number "1" of the specifically designated patterns is 3, and the number "m" of the data signals examined for coincidence decision is 3. In addition, the bit number "n" of the selection signals designating each specific pattern is 1. Under this condition, if the respective NOR gates shown in FIG. 1 are constituted of so-called CMOS logic gates, the number of required FETs is as follows:

$$2 \times 1 \, (m+n+1) = 2 \times 3(3+1+1) = 30$$

Similarly, in the case of l=10, m=5, and n=1, if a coincidence circuit is constituted in a manner similar to that of the circuit shown in FIG. 1, the coincidence circuit needs 140 FETs.

As mentioned above, the conventional general purpose coincidence decision circuits require a large number of FETs, and therefore, a power consumption is large. In addition, when the circuits are assembled in integrated circuits, a large chip area is required, and interconnection wiring is complicated.

SUMMARY OF THE INVENTION

Accordingly, it is one object of the present invention to provide a coincidence decision circuit which has dissolved the above mentioned drawbacks of the conventional circuits.

Another object of the present invention is to provide a coincidence decision circuit which can be constructed of a decreased number of FETs.

Still another object of the present invention is to provide a coincidence decision circuit which can operate with a reduced power consumption and which can be assembled in integrated circuits with a decreased chip area.

The above and other objects of the present invention are achieved in accordance with the present invention by a coincidence decision circuit which includes a plurality of data inputs and at least one coincidence decision output, comprising:

a plurality of coincidence detection means each having a plurality of inputs connected to a corresponding number of data inputs selected from the data inputs of the circuit, each of the coincidence detection means being selectively put in an operable condition in response to a given selection signal so as to generate an coincidence detection signal;

means connected to the coincidence detection means and responsive to a timing signal to read out the coincidence detection signal from the coincidence detection means put in the operable condition, and means connected to the read out means to output the coincidence detection signal at a predetermined timing.

In an embodiment of the present invention, each of the coincidence detection means includes an FET array which has at least three field effect transistors connected in parallel to one another between a first common line and a second common line. One of the field effect transistors receives a given selection signal at its gate, and the remaining field effect transistors receive the selected number of data inputs, so that the first common line generates the coincidence detection signal when all the transistors are put in off condition.

Each of the coincidence detection means is associated with a first switching field effect transistor adapted to receive a first timing signal at its gate. One end of the first switching transistor is connected to the first common line of the associated coincidence detection means, and the other end of each first switching transistor is connected to a first voltage supply terminal.

Furthermore, there is provided a second switching field effect transistor adapted to receive at its gate the first timing signal so as to assume the on-off condition opposite to that of each first transistor. One end of the second transistor is connected in common to the second common lines of all the coincidence detection means, and the other end of the second switching transistor is connected to a second voltage supply terminal.

The read out means includes a third switching field effect transistor associated to each of the coincidence detection means and connected at its gate to the first common line of the associated coincidence detection means and having one end connected to the second voltage supply terminal; and four switching field effect transistors receiving their gates a second timing control signal which changes its condition later than the change of the first timing control signal. Each of the fourth transistors is connected at its one end to the other end of the corresponding third transistor and at its other end to the coincidence decision output.

In addition, the output means includes a fifth switching field effect transistor connected between the first voltage supply terminal and the coincidence decision output, the fifth transistor receiving at its gate the first timing signal to assume the same condition as that of the first transistor.

According to a second aspect of the present invention, there is provided a coincidence decision circuit which includes a plurality of data inputs and at least one coincidence decision output, comprising:

a plurality of coincidence detection circuits each including an FET array which has at least three field effect transistors connected in parallel to one another betwwen a first common line and a second common line, one of the field effect transistor receiving a given selection signal at its gate, and the remaining field effect transistors receiving the selected number of data inputs, so that the first common line generates the coincidence detection signal;

first switching field effect transistors adapted to receive a first timing signal at their gates, one end of each first switching transistor being connected to the first common line of a corresponding coincidence detection circuit, the other end of the first switching transistor being connected to a first voltage supply terminal;

a second switching field effect transistor adapted to receive at its gate the first timing signal so as to assume the on-off condition opposite to that of the first transistor, one end of the second transistor being connected in common to the second common lines of all the coincidence detection circuits, the other end of the second switching transistor being connected to a second voltage supply terminal;

third switching field effect transistors each connected at its gate to the first common line of one coincidence detection circuit and having one end connected to the second voltage supply terminal; four switching field effect transistors receiving their gates a second timing control signal which changes its condition later than the change of the first timing control signal, each of the fourth transistors being connected at its one end to the other end of the corresponding third transistor and at its other end to the coincidence decision output; and a fifth switching field effect transistor connected between the first voltage supply terminal and the coincidence decision output, the fifth transistor receiving at its gate the first timing signal to assume the same condition as that of the first transistor.

The above and other objects, features and advantages of the present invention will be apparent from the following description of the preferred embodiment of the invention with reference to the accompanying drawings.

DESCRIPTION OF THE PREFERRED EMBODIMENT

Figure 2:
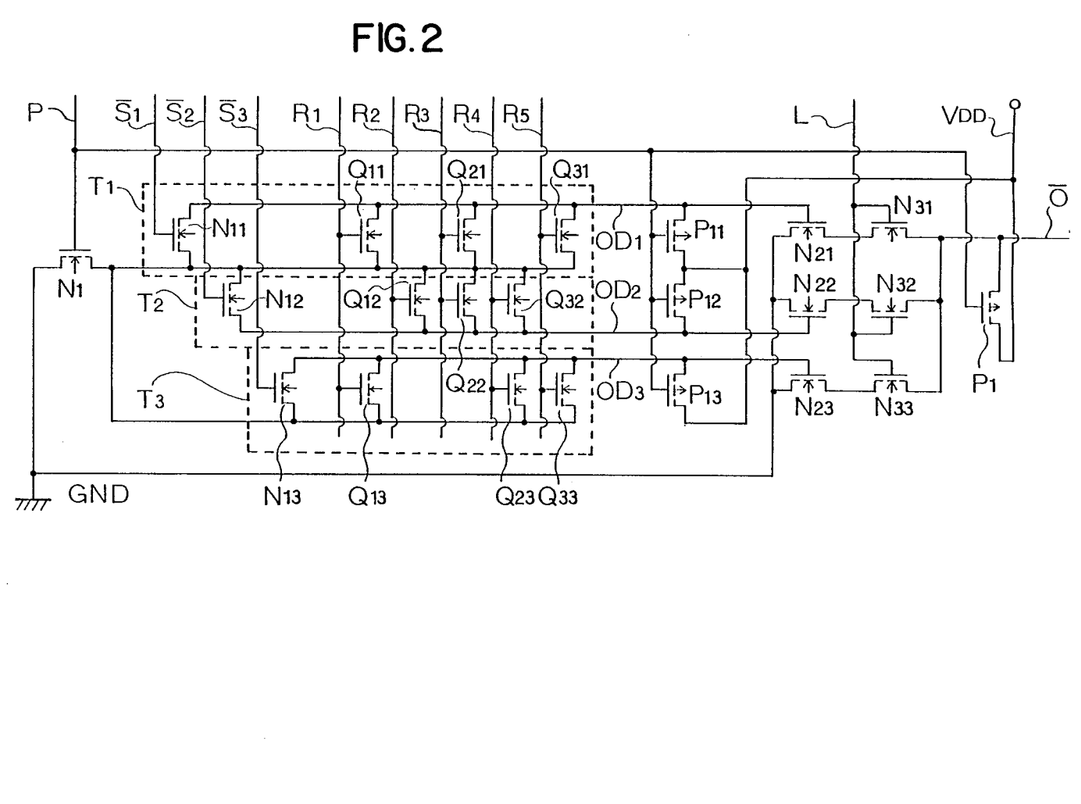
FIG. 2 is a circuit diagram of an embodiment of the coincidence decision circuit in accordance with the present invention.

Referring to FIG. 2, there is shown one embodiment of the coincidence decision circuit in accordance with the present invention. The shown circuit comprises three FET arrays $T_1$, $T_2$ and $T_3$. The first FET array $T_1$ includes four N-channel FETs $N_{11}$, $Q_{11}$, $Q_{21}$ an $Q_{31}$ which are connected in parallel to one another by common-connecting their drains and their sources, respectively. FET $N_{11}$ receives at its gate a first coincidence pattern selection signal $\bar{S}_1$, and FETs $Q_{11}$, $Q_{21}$ and $Q_{31}$ receive binary data signals $R_1$, $R_3$ and $R_5$ at their gates, respectively. The second FET array $T_2$ includes four N-channel FETs $N_{12}$, $Q_{12}$, $Q_{22}$ and $Q_{32}$ which are connected in parallel to one another by common-connecting their drains and their sources, respectively. FET $N_{12}$ receives at its gate a second coincidence pattern selection signal $\bar{S}_2$, and FETs $Q_{12}$, $Q_{22}$ $Q_{32}$ receive binary data signals $R_2$, $R_3$ and $R_4$ at their gates, respectively. The third FET array $T_3$ includes four N-channel FETs $N_{13}$, $Q_{13}$, $Q_{23}$ and $Q_{33}$ which are connected in parallel to one another by common-connecting their drains and their sources, respectively. FET $N_{13}$ receives at its gate a third coincidence pattern selection signal $\bar{S}_3$, and FETs $Q_{13}$, $Q_{23}$ and $Q_{33}$ receive binary data signals $R_1$, $R_4$ and $R_5$ at their gates, respectively. Further, the source common lines of the respective FET arrays $T_1$, $T_2$ and $T_3$ are common-connected.

In addition, the coincidence decision circuit includes a source-grounded N-channel FET $N_1$ whose gate is connected to receive a first timing control signal P and whose drain is connected to the source common line of the FET arrays $T_1$, $T_2$ and $T_3$. Further the timing control signal P is supplied to gates of three P-channel FETs $P_{11}$, $P_{12}$ and $P_{13}$, respectively, whose sources are connected in common to a voltage supply terminal $V_{DD}$. The drains of the P-channel FETs $P_{11}$, $P_{12}$ and $P_{13}$ are respectively connected to the drain common lines $OD_1$, $OD_2$ and $OD_3$ of the three FET arrays $T_1$, $T_2$ and $T_3$. Furthermore, the respective drain common lines $OD_1$, $OD_2$ and $OD_3$ of the FET arrays are connected to gates of three source-grounded N-channel FETs $N_{21}$, $N_{22}$ and $N_{23}$, respectively, whose drains are in turn connected to sources of another set of N-channel FETs $N_{31}$, $N_{32}$ and $N_{33}$. These FETs $N_{31}$, $N_{32}$ and $N_{33}$ receive at their gates a second timing control signal L, and commonly connected at their drains to a drain of a P-channel FET $P_1$. This FET $P_1$ receives at its gate the first timing control signal P, and is connected at its source to the voltage supply signal terminal $V_{DD}$. The drain of the FET $P_1$ generates a decision output signal "$\bar{O}$".

Figure 3:
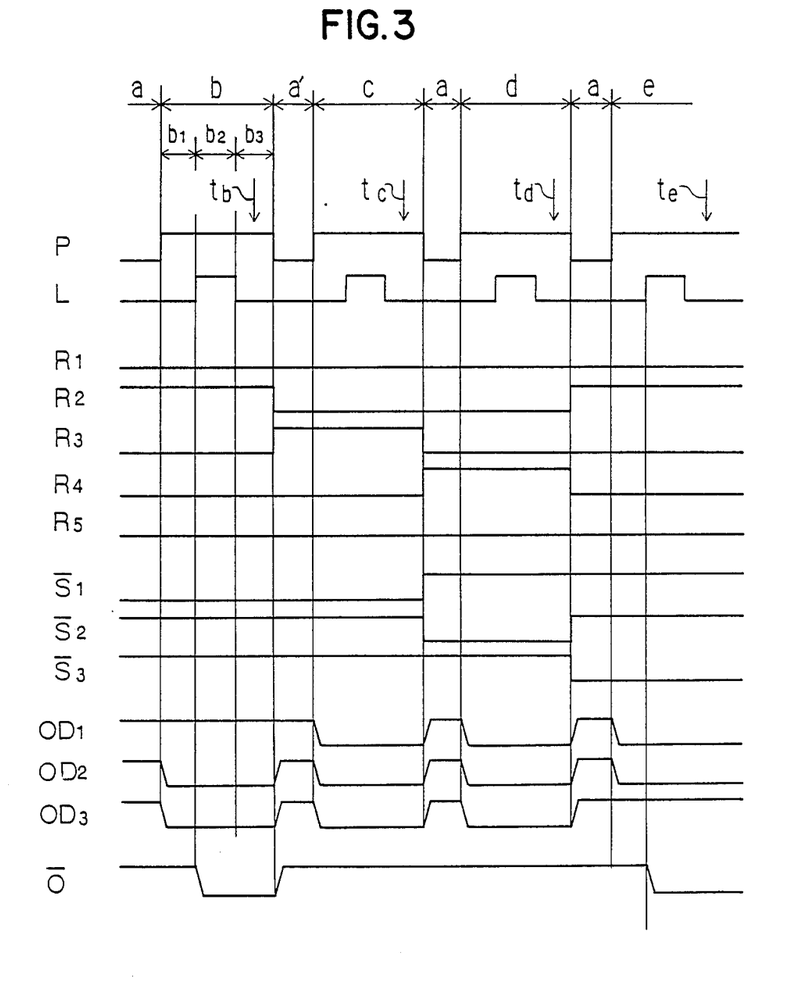
FIG. 3 is a timing chart for explaining the operation of the circuit shown in FIG. 2.

Next, the operation will be explained with reference to FIG. 3 illustrating the time charts at various points in the circuit shown in FIG. 2.

As seen from FIG. 3, the first timing control signal P assumes a logical level of "0" during a period "a" and a logical level of "1" during periods "b", "c", "d" and "e". On the other hand, the second timing control signal L assumes the logical level of "1" at a time lag of a sub-period "$b_1$" from when the first control signal assumes "1", and this second timing control signals L is maintained at the logical level of "1" during a sub-period of time "$b_2$". In addition, the second timing control signal L is brought into the logical level of "0" the time of sub-period "$b_3$" before when the first timing control signal P is rendered "$\overline{O}$".

Thus, during the period "a", FET $N_1$ is off, and so, each FET of the FET arrays $T_1$, $T_2$ and $T_3$ is isolated from the ground. On the other hand, since FETs $P_{11}$, $P_{12}$ and $P_{13}$ are on, the gates of FETs $N_{21}$, $N_{22}$ and $N_{23}$ are charged to the supply voltage $V_{DD}$. In addition, since FETs $N_{31}$, $N_{32}$ and $N_{33}$ are off and at the same time FET $P_1$ is on, the drain of FET $P_1$ is charged to the supply voltage $V_{DD}$. Accordingly, the three drain common lines $OD_1$, $OD_2$ and $OD_3$ and the decision output "$\overline{O}$" are brought into the supply voltage $V_{DD}$, i.e., the logical level of "1".

As seen from the above, during the above mentioned period "a", the gates of FETs $N_{21}$, $N_{22}$ and $N_{23}$ and the drain of FET $P_1$ are precharged so that the circuit is set at an initial condition of coincidence decision operation cycle. In this operation, FETs $P_{11}$, $P_{12}$, $P_{13}$, FET $N_1$ and FET $P_1$ serve as switch mean for controlling the precharge.

During the period "b", it is decided whether or not the train of data signals $R_1$ to $R_5$ is consistent with the specific pattern designated by the first coincidence pattern selection signal $\overline{S}_1$. The coincidence pattern selection signal $\overline{S}$ is supplied to the FET array $T_1$, which includes the three FETs $Q_{11}$, $Q_{21}$ and $Q_{31}$ which receive the data signal $R_1$, $R_3$ and $R_5$, respectively. Namely, the pattern (0, X, 0, X, 0) is designated by the coincidence pattern selection signals $\overline{S}_1$. In this situation, therefore, the coincidence pattern selection signals $\overline{S}_1$, $\overline{S}_2$ and $\overline{S}_3$ are made "0", "1" and "1", respectively.

Thus, in the FET arrays $T_2$ and $T_3$, FETs $N_{12}$ and $N_{13}$ are on, and FETs $P_{12}$ and $P_{13}$ are off. In addition, FET $N_1$ is on. Therefore, the gates of FETs $N_{22}$ and $N_{23}$ are brought to the ground level, i.e., the logical level of "0", so that FETs $N_{22}$ and $N_{23}$ are off.

On the other hand, in the example shown in FIG. 3, since all the data signals $R_1$, $R_3$ and $R_5$ are "0", all FETs included in the FET array $T_1$ are off, so that the gate of FET $N_{21}$ is maintained at the level which was precharged during the period "a". Namely, FET $N_{21}$ is maintained in on condition.

Accordingly, the drain common lines $OD_1 OD_2$ and $OD_3$ are brought into "1", "0" and "0", respectively, during a first sub-period "$b_1$". Namely, this sub-period "$b_1$" determines the on-off conditions of the FETs $N_{21}$, $N_{22}$ and $N_{23}$, thereby to determine the logical levels of the drain common lines $OD_1$, $OD_2$ and $OD_3$.

During the succeeding sub-period "$b_2$", FETs $N_{31}$, $N_{32}$ and $N_{33}$ are turned on by the second timing control signal L. On the other hand, FET $P_1$ is maintained off by the first timing control signal P. Therefore, the drain of the FET $P_1$ is charged to the ground level through FETs $N_{31}$ and $N_{21}$, so that the decision output "$\overline{O}$" generates a logical signal of "0". Thus, the sub-period "b" can be said to be a period for reading out the results of coincidence decisions appearing on the drain common lines $OD_1$, $OD_2$ and $OD_3$, to the decision output "$\overline{O}$".

During the sub-period "$b_3$" succeeding to the sub-period "$b_2$", FETs $N_{31}$, $N_{32}$ and $N_{33}$ are turned off, so that the drain of FET $P_1$ is maintained at the logical level charged during the sub-period "$b_2$", In other words, the decision output "$\overline{O}$" read out during the sub-period "$b_2$" are maintained. Thus, at any timing "$t_b$" during the sub-period "$b_3$", the decision output "$\overline{O}$" is sampled by a circuit (not shown) associated to the coincidence decision circuit. In the period "a" shown in FIG. 3, the train of data signals ($R_1$ to $R_5$) is (0, 1, 0, 0, 0), which is consistent with the specific pattern (0, X, 0, X, 0) designated by the coincidence pattern selection signal $\overline{S}_1$. Therefore, the decision output "$\overline{O}$" sampled at the timing "$t_b$" is "0" which indicates "coincidence".

During the period "a" succeeding to the period "b", the circuit is initialized again. Then, during the period "c", it is decided whether or not the train of data signals $R_1$ to $R_5$ is consistent with the specific pattern (0, X, 0, X, 0) designated by the coincidence pattern selection signal $\overline{S}_1$. Therefore, during the period "c" the coincidence pattern selection signals $\overline{S}_1$, $\overline{S}_2$ and $\overline{S}_3$ are maintained at "0", "1" and "1", respectively, and so, FETs $N_{22}$ and $N_{23}$ are off. But, in this period "c" the data signal $R_3$ of "1" is applied to FET $Q_{21}$ in the FET array $T_1$, and so, the FET $Q_{21}$ is turned on, with the result that the gate of FET $N_{21}$ is brought to the ground level. Therefore, FET $N_{21}$ is turned off similarly to FETs $N_{22}$ and $N_{23}$, so that the drain of FET $P_1$ is maintained at the level precharged during the period "a" irrespectively of the on-off condition of FETs $N_{31}$, $N_{32}$ and $N_{33}$. Thus, the decision output "$\overline{O}$" of "1" is read out at a timing "$t_c$" during the period "c".

Namely, in the period "c" shown in FIG. 3, the train of data signals ($R_1$ to $R_5$) is (0, 0, 1, 0, 0), which is not consistent with the specific pattern (0, X, 0, X, 0) designated by the coincidence pattern selection signal $\overline{S}_1$. Therefore, the decision output "$\overline{O}$" of "0" indicating "inconsistence" is sampled at the timing "$t_c$".

During the next period "a" the circuit is initialized again, and during the succeeding period "d" it is decided whether or not the train of data signals $R_1$ to $R_5$ is consistent with the specific pattern designated by the coincidence pattern selection signal $\overline{S}_2$. The coincidence pattern selection signal $\overline{S}_2$ is supplied to the FET array $T_2$ which includes the three FETs $Q_{12}$, $Q_{22}$ and $Q_{32}$ which receive the data signal $R_2$, $R_3$ and $R_4$, respectively. Namely, the pattern (X, 0, 0, 0, X) is designated by the coincidence pattern selection signal $\overline{S}_2$. In this situation, therefore, the coincidence pattern selection signals $\overline{S}_1$, $\overline{S}_2$ and $\overline{S}_3$ are made "1", "0" and "1", respectively, during the period "d".

Thus, in the FET arrays $T_1$ and $T_3$, FETs $N_{11}$ and $N_{13}$ are on, and so, the drain common lines $OD_1$ and $OD_3$ are brought to "0", with the result that FETs $N_{21}$ and $N_{23}$ are turned off.

In the example shown in FIG. 3, since the data signal $R_4$ of "1" is applied to the FET array $T_2$, FET $Q_{32}$ is turned on. As a result, the drain common line $OD_2$ is also brought to "0", and so, FET $N_{22}$ is also turned off. Thus, the drain of FET $P_1$ is maintained at the level precharged during the period "a" irrespectively of the on-off condition of FETs $N_{31}$, $N_{32}$ and $N_{33}$. Accordingly, the decision output "$\overline{O}$" of "1" is read out at a timing "$t_c$" during the period "c".

Namely, in the period "d" shown in FIG. 3, the train of data signals ($R_1$ to $R_5$) is (0, 0, 0, 1, 0), which is not consistent with the specific pattern (X, 0, 0, 0, X) designated by the coincidence pattern selection signal $S_2$. Therefore, the decision output "$\overline{O}$" of "0" indicating "inconsistence" is sampled at the timing "$t_d$".

Further, during the next period "a" the circuit is initialized again, and then during the succeeding period "e" it is decided whether or not the train of data signals $R_1$ to $R_5$ is consistent with the specific pattern designated by the coincidence pattern selection signal $\overline{S}_3$. The FET array $T_3$ receiving the coincidence pattern selection signal $\overline{S}_3$ includes the three FETs $Q_{13}$, $Q_{23}$ and $Q_{33}$ which receive the data signal $R_1$, $R_4$ and $R_5$, respectively. Namely, the pattern (0, X, X, 0, 0) is designated by the selection signal $\overline{S}_3$, and the coincidence pattern selection signals $\overline{S}_1$, $\overline{S}_2$ and $\overline{S}_3$ are made "1", "1" and "0", respectively.

In this situation, FETs $N_{21}$ and $N_{22}$ are turned on, so that the drain common lines $OD_1$ and $OD_2$ are brought to "0". In addition, in the period "e" of FIG. 3, since all the data signals $R_1$, $R_4$ and $R_5$ are "0", all FETs included in the FET array $T_3$ are off, so that the drain common line $OD_3$, i.e., the gate of FET $N_{23}$ is maintained at the level of "1" which was precharged during the period "a". Namely, FET $N_{23}$ is maintained in on condition.

Accordingly, when the second timing control signal L becomes "1", FETs $N_{31}$, $N_{32}$ and $N_{33}$ are turned on, and on the other hand, FET $P_1$ is maintained off by the first timing control signal P. Therefore, the drain of the FET $P_1$ is charged to the ground level through FETs $N_{33}$ and $N_{23}$, so that the decision output "$\overline{O}$" generates a logical signal of "0". In the period "e" shown in FIG. 3, the train of data signals ($R_1$ to $R_5$) is (0, 1, 0, 0, 0), which is consistent with the specific pattern (0, X, X, 0, 0) designated by the coincidence pattern selection signal $\overline{S}_3$. Accordingly, the decision output "$\overline{O}$" sampled at the timing "$t_e$" is "0" which indicates "coincidence".

Figure 4:
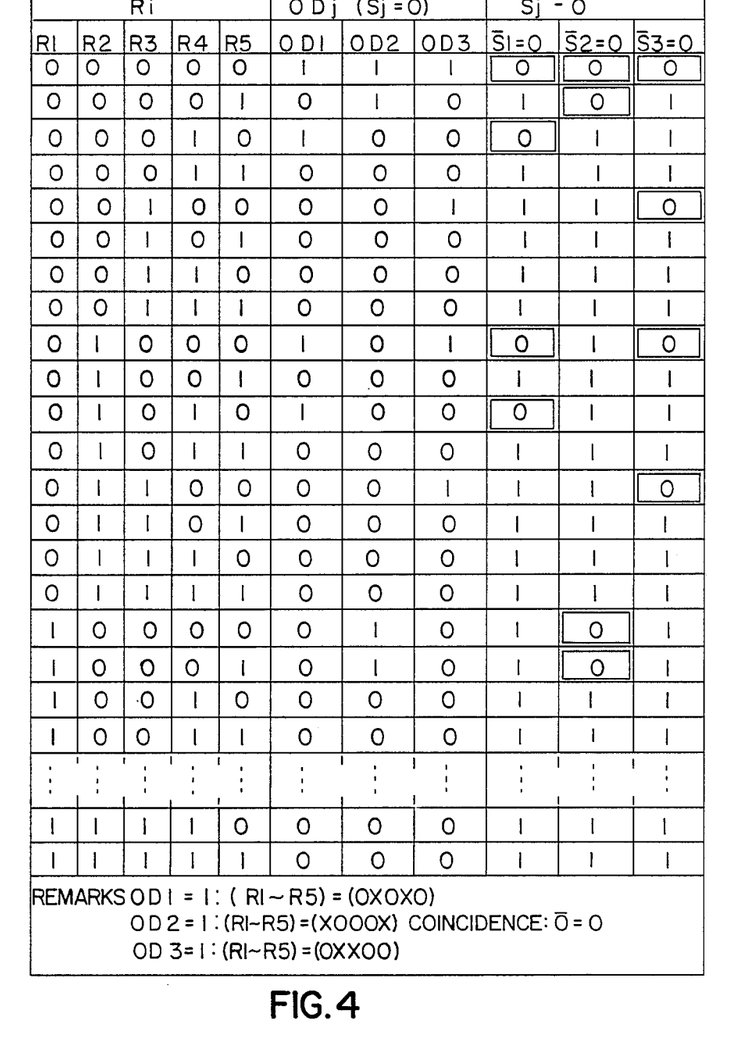
FIG. 4 is a truth table showing possible combinations of input data signals and a corresponding coincidence output in the circuits shown in FIG. 2.

All possible combinations of input data signals and corresponding decision outputs in the embodiment shown in FIG. 2 are indicated in FIG. 4. In this figure, the values of the signals $OD_1$, $OD_2$ and $OD_3$ indicate the values when the corresponding coincidence pattern selection signals $\overline{S}_1$, $\overline{S}_2$ and $\overline{S}_3$ are "0". As mentioned hereinbefore, when the selection signals $\overline{S}_j$ is "1", the corresponding signal $OD_j$ assumes "1". All the decision outputs "$\overline{O}$" of "0" are surrounded by a frame, so that it can be easily notified that the result of decision indicates "coincidence". Incidentally, some of possible combinations of input data signals is omitted, but the omitted combinations do not include the case in which the result of decision is "coincidence".

In the embodiment as mentioned above, the number "l" of specific patterns is 3, and the number "m" of data signals examined for coincidence decision is 3. In addition, the bit number "n" of each selection signal designating one specific pattern is 1. Under this condition, the number of FETs required in the embodiment is determined as follows:

$$l(m+n+3)+2=3(3+1+3)+2=23$$

For example, in the case of l=10, m=5 and n=1, if a coincidence decision circuit is constructed similarly to the circuit shown in FIG. 2, it can be constructed of 92 FETs. In any case, even if l, m and n assume any values, the coincidence circuit can be constructed of FETs of the number less than that of FETs required in the conventional coincidence circuit. Further, the circuit shown in FIG. 2 is of negative logic in which the logic signal "0" indicates "coincidence". But, the present invention can be applied to a positive logic coincidence decision circuit.

The invention has thus been shown and described with reference to specific embodiments. However, it should be noted that the invention is in no way limited to the details of the illustrated structures but changes and modifications may be made within the scope of the appended claims.

I claim:

1. A coincidence decision circuit which includes a plurality of data inputs and at least one coincidence decision output, said circuit comprising:
   a plurality of coincidence detection means coupled to receive data signals via the plurality of data inputs and to receive a plurality of selection signals, each of the coincidence detection means including an FET array which has at least three field effect transistors connected in parallel with one another between a first common line and a second common line, one of the field effect transistors having a gate which receives one of the selection signals, and the remaining ones of the field effect transistors in said array respectively receiving said data signals at their gates, thus providing a corresponding number of data inputs selected from among the plurality of the data inputs, so that the first common line generates a coincidence detection signal when all of the transistors are in an off condition;
   means connected to the coincidence detection means for reading out the coincidence detection signal from each of the coincidence detection means, the read out means including first switching field effect transistors, each of said first switching transistors being associated with one of the coincidence detection means and being connected at its gate to the first common line of the associated coincidence detection means and having one end connected to a first voltage supply terminal, and second switching field effect transistors receiving at their gates a timing signal, each of the second transistors being connected at its one end to the other end of the corresponding first transistor and at its other end to the coincidence decision output; and
   output means connected to the read out means and receiving another timing signal so as to output the coincidence detection signal at a predetermined timing.

2. The circuit of claim 1 wherein the first common line of each FET array is connected at one end of a third switching field effect transistor which is connected to receive at its gate a second timing signal which causes the third switching transistor to turn off earlier than the turn-on of the second switching transistor caused by the first timing control signal, the other end of the third switching transistor being connected to a second voltage supply terminal.

3. The circuit of claim 2 further including a fourth switching field effect transistor having a channel conductivity which is opposite to the channel conductivity of the third switching field effect transistors, said fourth switching transistor being coupled to receive at its gate the second timing signal so as to assume an on-off condition which is opposite to the on-off condition of each third switching transfer, one end of the fourth transistor being connected in common to the second common lines of all the coincidence detection means, the other end of the fourth switching transistor being connected to the first voltage supply terminal.

4. A circuit as claimed in claim 3 wherein the output means includes a fifth switching field effect transistor connected between the first voltage supply terminal and the coincidence decision output, the fifth transistor receiving at its gate the first timing signal to assume the same condition as that of the first transistor.

5. A coincidence decision circuit which includes a plurality of data inputs and at least one coincidence decision output, said circuit comprising:

a plurality of coincidence detection means coupled to receive data signals via the plurality of data inputs and a plurality of selection signals, each of the coincidence detection means including an FET array which has at least three field effect transistors connected in parallel with one another between a first common line and a second common line, one of the field effect transistors having a gate for receiving one of the selection signals, and the remaining of the field effect transistors in the array respectively receiving said data signals at their gates from a corresponding number of data inputs selected from among the plurality of the data inputs, so that the first common line generates a coincidence detection signal when all of the transistors are switched into an off condition;

a plurality of first switching field effect transistors provided in a one-to-one relation for the coincidence detection means, each of the first switching field effect transistors being connected to receive a first timing signal at its gate, one end of each first switching transistor being connected to the first common line of the associated coincidence detection means, the other end of the first switching transistor being connected to a first voltage supply terminal;

a second switching field effect transistor having a channel conductivity which is opposite the channel conductivity of the first switching field effect transistors, said second switching field effect transistor being coupled to receive at its gate the first timing signal so as to assume an on-off condition which is opposite to the on-off condition of each first field effect transistor, one end of the second transistor being connected in common to the second common lines of all the coincidence detection means, the other end of the second switching transistor being connected to a second voltage supply terminal;

means connected to the coincidence detection means for reading out the coincidence detection signal from each of the coincidence detection means, the read out means including third switching field effect transistors, each of said third switching transistors being associated with one of the coincidence detection means and connected at its gate to the first common line of the associated coincidence detection means and having one end connected to the second voltage supply terminal, and fourth switching field effect transistors having gates for receiving a second timing signal which causes the fourth switching transistor to turn on later than the turn-on of the second switching transistor in response to the first timing control signal, each of the fourth transistors being connected at its one end of the other end of the corresponding third transistor and at its other end to the coincidence decision output; and output means connected to the read out means and receiving another timing signal so as to output the coincidence detection signal at a predetermined timing.

6. A coincidence decision circuit which includes a plurality of data inputs and at least one coincidence decision output, said circuit comprising:

a plurality of coincidence detection means coupled to receive data signals via the plurality of data inputs, each of the coincidence detection means including an FET array which has at least two field effect transistors connected in parallel with one another between a first common line and a second common line, these field effect transistors having gates for respectively receiving a corresponding number of data inputs selected from the plurality of the data inputs, so that the first common line generates a coincidence detection signal when all the transistors are in an off condition;

selection means coupled to the coincidence detection means for receiving a plurality of selection signals so as to cause a selected one of the coincidence detection means to output the coincidence detection signal;

means for precharging the coincidence detection means at a first timing; and means connected to the coincidence detection means for reading out the coincidence detection signal from each of the coincidence detection means, the read out means including first switching field effect transistors, each of said first switching field effect transistors being associated with one of the coincidence detection means and being connected at its gate to the first common line of the associated coincidence detection means and having one end connected to a first voltage supply terminal, and second switching field effect transistors having gates for receiving a timing signal, each of the second transistors being connected at its one end to the other end of the corresponding first transistor and at its other end to the coincidence decision output.

7. The circuit of claim 6 wherein the precharge means includes third switching field effect transistors, each of said third transistors being associated with one of the coincidence detection means in a manner such that one end of each third switching transistor is connected to the first common line of the associated coincidence detection means, and connected at the other end of the third switching transistor to a second voltage supply terminal, each of the third transistors having a gate for receiving a second timing signal which turns on said third transistor to precharge the first common line of the associated coincidence detection means to the potential of the third voltage supply terminal, said second timing signal causing the third switching transistor to turn off earlier than the turn-on of the second switching transistor caused by the first timing control signal.

8. The circuit of claim 7 wherein the precharge means also includes a fourth switching field effect transistor connected at its one end in common to the second common lines of all the coincidence detection means, and connected at its other end to the first voltage supply terminal, the fourth transistor having a gate for receiving the second timing signal so as to assume an on-off condition which is opposite to the on-off condition of each third transistor, whereby when the third transistors are turned on so as to precharge the first common line of the coincidence detection means, the second common line is isolated from the first voltage supply terminal.

9. The circuit of claim 8 wherein the selection means includes a field effect transistor connected between the first and second common lines of each FET array and having a gate adapted to receive a selection signal so as to selectively apply a short-circuit between the first and second common lines of the associated FET array.

10. A circuit as claimed in claim 9 wherein the output means includes a fifth switching field effect transistor connected between the first voltage supply terminal and the coincidence decision output, the fifth transistor receiving at its gate the first timing signal to assume the same condition as that of the first transistor, so as to precharge the coincidence decision output to the potential of the first voltage supply terminal.

11. A coincidence decision circuit which includes a plurality of data inputs and at least one coincidence decision output, comprising:

a plurality of coincidence detetection means coupled to receive data signals via the plurality of data inputs, each of the coincidence detection means including an FET array which has at least two field effect transistors connected in parallel with one another between a first common line and a second common line, these field effect transistors having gates for respectively receiving a corresponding number of data inputs selected from the plurality of the data inputs, so that the first common line generates a coincidence detection signal when all the transistors are switched into an off condition;

selection means coupled to the coincidence detection means and receiving a plurality of selection signals so as to cause a selected one of the coincidence detection means to output the coincidence detection signal;

means for precharging the coincidence detection means at a first timing, the precharging means including first switching field effect transistors provided for the coincidence detection means in a one-to-one relation, each of the first switching field effect transistors having a gate connected to receive a first timing signal, one end of each first switching transistor being connected to the first common line of the associated coincidence detection means, the other end of the first switching transistor being connected to a first voltage supply terminal so that the first common line of each FET array is precharged when the first field effect transistors are turned on, the precharging means also including a second switching field effect transistor having a conductivity channel which is opposite to the conductivity of the channel conductivity type to the first switching field effect transistors, the second switching transistor being coupled to receive the first timing signal at its gate so as to assume the on-off condition which is opposite to the on-off condition of each first field effect transistor, one end of the second transistor being connected in common to the second common lines of all the coincidence detection means, the other end of the second switching transistor being connected to a second voltage supply terminal, so that when the second switching transistor is in an on condition, the charges on the first common lines of each FET array can be discharged through the second switching transistor if at least one of the field effect transistors included in that FET array is then turned on in response to the input data;

means coupled to the coincidence detection means for reading out the coincidence detection signal from each of the coincidence detection means, the read out means including third switching field effect transistors, each of said third transistors being associated with one of the coincidence detection means and being connected at its gate to the first common line of the associated coincidence detection means and having one end connected to the second voltage supply terminal, and fourth switching field effect transistors having gates for receiving a second timing signal which causes the fourth switching transistor to turn on later than the turn-on of the second switching transistor in response to the first timing control signal, each of the fourth transistors being connected at its one end to the other end of the corresponding third transistor and being connected at its other end to the coincidence decision output; and output means connected to the read out means and receiving another timing signal so as to output the coincidence detection signal so as to output the coincidence detection signal at a predetermined timing.

12. A coincidence decision circuit which includes a plurality of data inputs and at least one coincidence decision output, said decision circuit comprising:

a plurality of coincidence detection circuits each including an FET array which has at least three field effect transistors connected in parallel with one another between a first common line and a second common line, one of the field effect transistors having a gate for receiving one selection signal from among a plurality of selection signals, and the remaining field effect transistors having gates for receiving data signals via a corresponding number of data inputs selected from the plurality of data inputs, so that the first common line generates the coincidence detection signal;

first switching field effect transistors having gates for receiving a first timing signal, one end of each first switching transistor being connected to the first common line of a corresponding coincidence detection circuit, the other end of the first switching transistor being connected to a first voltage supply terminal;

a second switching field effect transistor having a channel conductivity which is opposite to the channel conductivity type to the first switching field effect transistors, said second transistor having a gate for receiving the first timing signal so as to assume an on-off condition which is opposite to the on-off condition of the first transistor, one end of the second transistor being connected in common to the second common lines of all the coincidence detection circuits, the other end of the second switching transistor being connected to a second voltage supply terminal;

third switching field effect transistors, each of said third transistors having a gate connected to the first common line of one coincidence detection circuit and having one end connected to the second voltage supply terminal;

fourth switching field effect transistors having gates for receiving a second timing control signal which causes the fourth switching transistor to turn on later than the turn-on of the second switching transistor in response to the first timing control signal, each of the fourth transistors being connected at its one end to the other end of the corresponding third transistor and at its other end to the coincidence decision output; and a fifth switching field effect transistor connected between the first voltage supply terminal and the coincidence decision output, the fifth transistor having a gate for receiving the first timing signal which places the fifth transistor in an on-off condition which is the same as the on-off condition of the first transistor.

* * * * *